United States Patent [19]

Ishikawa et al.

[11] Patent Number: 5,445,869

[45] Date of Patent: Aug. 29, 1995

[54] COMPOSITE FLEXIBLE SUBSTRATE

[75] Inventors: Takayuki Ishikawa, Amagasaki; Kouichi Santo, Obama, both of Japan

[73] Assignee: Matsushita Electric Industrial Co., Ltd., Kadoma, Japan

[21] Appl. No.: 184,106

[22] Filed: Jan. 21, 1994

[30] Foreign Application Priority Data

Jan. 21, 1993 [JP] Japan ................... 5-008094

[51] Int. Cl.6 ................................ B32B 9/00
[52] U.S. Cl. .................... 428/209; 428/480; 428/901
[58] Field of Search ............... 428/209, 901, 480

[56] References Cited

U.S. PATENT DOCUMENTS

| 3,679,473 | 7/1972 | Blatchford et al. | 428/210 |
| 4,311,749 | 1/1982 | Hiraiwa et al. | 428/209 |
| 4,626,462 | 12/1986 | Kober et al. | 428/137 |
| 5,288,542 | 2/1994 | Cibulsky et al. | 428/209 |

FOREIGN PATENT DOCUMENTS

| 55-75173 | 5/1980 | Japan . |
| 59-3563 | 1/1984 | Japan . |
| 62-134280 | 8/1987 | Japan . |
| 62-145362 | 9/1987 | Japan . |
| 4144186 | 5/1992 | Japan . |

*Primary Examiner*—Patrick J. Ryan
*Assistant Examiner*—Kam F. Lee
*Attorney, Agent, or Firm*—Cushman, Darby & Cushman

[57] ABSTRACT

A composite flexible substrate (100) is constituted with an inside flexible substrate (1) and an outside flexible substrate (2) having a zigzag-shaped part ($Z_1$), and the outside flexible substrate (2) is superposed on the inside flexible substrate (1) and is fixed at both end parts of the inside flexible substrate (1) and the outside flexible substrate (2). When the inside flexible substrate (1) is longitudinally bent, the outside flexible substrate (2) is deformed due to stretching of the zigzag-shaped part ($Z_1$) without irregularly deforming the inside flexible substrate.

2 Claims, 4 Drawing Sheets

COMPOSITE FLEXIBLE SUBSTRATE

FIELD OF THE INVENTION AND RELATED ART STATEMENT

1. Field of the Invention

This invention relates to a flexible substrate used for electronic apparatus or the like. More particularly the present invention relates to a composite flexible substrate which is formed by piling up plural flexible substrates and welding at both opposite ends of the plural flexible substrates, respectively.

2. Description of the Prior Art

The prior art will be explained with reference to FIGS. 7 and 8. FIG. 7 is a vertical sectional view showing a conventional composite flexible substrate. FIG. 8 is a vertical sectional view showing a conventional composite flexible substrate which is in a bent condition.

In FIG. 7, the conventional composite flexible substrate 101 is constituted with an inside flexible substrate 11 and an outside flexible substrate 12. The inside flexible substrate 11 comprises a first printed circuit 11c, a first insulating member 11d and a first base member 11f. Furthermore, in the inside flexible substrate 11, a first connecting part 11a is provided at one end part of the first base member 11f, and a second connecting part 11b is provided at the opposite end part of the first base member 11f. The first printed circuit 11c is formed on one surface of the first base member 11f by a printing method. Additionally, the first printed circuit 11c is covered with the first insulating member 11d except for the first connecting part 11a and the second connecting part 11b. Similarly, the outside flexible substrate 12 comprises a second printed circuit 12c, second insulating member 12d and a second base member 12f. Furthermore, in the outside flexible substrate 12, a third connecting part 12a is provided at one end part of the second base member 12f, and a fourth connecting part 12b is provided at the other end part of the second base member 12f. The second printed circuit 12c is formed on one surface of the second base member 12f by the printing method. Additionally, the second printed circuit 12c is covered with the second insulating member 12d except for the third connecting part 12a and the fourth connecting part 12b.

Subsequently, in the conventional composite flexible substrate 101, the inside flexible substrate 11 is mechanically fixed on the outside flexible substrate 12 so as to weld the first connecting part 11a and the second connecting part 11b to the third connecting part 12a and the fourth connecting part 12b, respectively. Thereby, the first printed circuit 11c is electrically connected with the second printed circuit 12c. In many cases in such composite flexible substrate 101, an electro-static shielding sheet (not shown) is formed on the other surface of the second base member 12f.

Apart from the aforementioned prior art where the first printed circuit 11c is electrically connected with the second printed circuit 12c, an alternative configuration may be such that the first printed circuit 11c is not electrically connected with the second printed circuit 12c so that the first printed circuit 11c is not formed on the first connecting part 11a.

When such a composite flexible substrate 101 is installed in an electric apparatus (not shown) and the composite flexible substrate 101 is bent as shown in FIG. 8, a bent portion of the inside flexible substrate 11 generates an irregular wrinkle-shaped deformation 11g. Therefore, it is necessary that the electric apparatus becomes large-sized in order to secure a space for the irregular wrinkle-shaped deformation 11g. Furthermore, there is a fear that the first printed circuit 11c is partly cut off. Since two connection portions between the inside flexible substrate 11 and the outside flexible substrate 12, which are provided at both ends of the conventional composite flexible substrate 101, receive a heavy stress, there occurs a problem that the inside flexible substrate 11 is slipped off the outside flexible substrate 12. Accordingly, the conventional composite flexible substrate 101 is destroyed and the first printed circuit 11c is disconnected from the second printed circuit 12c.

OBJECT AND SUMMARY OF THE INVENTION

The object of the present invention is to provide a composite flexible substrate that can solve the aforementioned problems.

In order to achieve the above object, a composite flexible substrate in accordance with the present invention comprises:

a first flexible substrate having a first base member, a first printed circuit and a first insulating member, the first base member having a first connecting part at one end part and a second connecting part at the other end part, the first printed circuit being formed on said first base member and substantially covered with the first insulating member, and a second flexible substrate having a second base member, a second printed circuit and a second insulating member, the second base member having a third connecting part at one end part and a fourth connecting part at the other end part, the second printed circuit being formed on said second base member and substantially covered with the second insulating member.

The second flexible substrate is fixed over the first flexible substrate by fixing together the first connecting part and the second connecting part to the third connecting part and the fourth connecting part, respectively. The second flexible substrate has zigzag-shaped central portion which is constructed and arranged to deform and extend the second flexible substrate in overall length between the third and fourth connecting parts to prevent irregular deformation of the first flexible substrate when the composite flexible substrate is longitudinally bent in a direction to stretch the zigzag-shaped portion.

In the composite flexible substrate of the present invention, since the zigzag-shaped part is provided with the second flexible substrate which is an outside flexible substrate in bent condition of the composite flexible substrate, the zigzag-shaped part is deformed in bent condition of the composite flexible substrate. Therefore, the composite flexible substrate does not generate the irregular wrinkle-shaped deformation of the prior art such as seen in FIG. 8. Furthermore, two connection portions between the inside flexible substrate 11 and the outside flexible substrate 12 is not received an undesirable heavy stress.

DESCRIPTION OF THE PREFERRED EMBODIMENTS

Hereafter, preferred embodiments of a composite flexible substrate of the invention are described with reference to the accompanying drawings.

FIRST EXAMPLE

Figure 1:
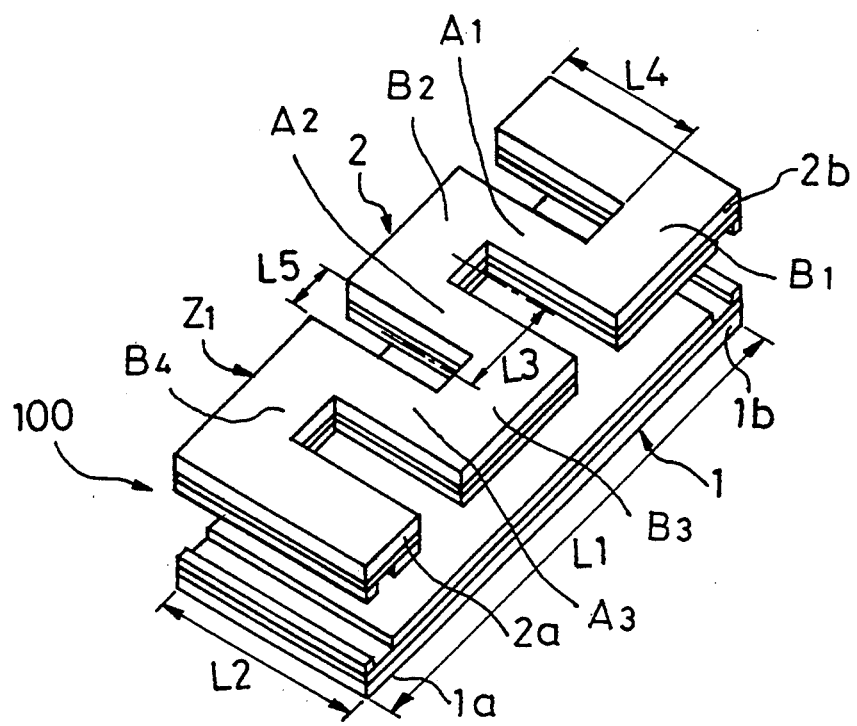
FIG. 1 is a perspective view showing a composite flexible substrate of a first embodiment of the present invention.
Figure 2:
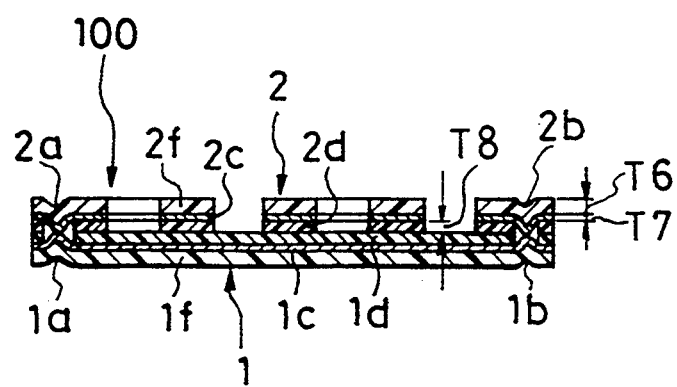
FIG. 2 is a vertical sectional view showing the composite flexible substrate of the first embodiment of the present invention.

FIG. 1 is a perspective view showing the composite flexible substrate of a first embodiment of the present invention. FIG. 2 is a vertical sectional view showing the composite flexible substrate of the first embodiment of the present invention.

In FIG. 1. the composite flexible substrate 100 is constituted with an inside (first) flexible substrate 1 and an outside (second) flexible substrate 2 having a zigzag-shaped part $Z_1$. Furthermore, in the composite flexible substrate 100, after the outside flexible substrate 2 is superposed on the inside flexible substrate 1, both opposite end parts (1a and 2a, 1b and 2b) of the composite flexible substrate 100 are welded by known ultrasonic welding or thermocompression bonding or the like. In the outside flexible substrate 2, the zigzag-shaped part $Z_1$ comprising three crosswise arm portions $A_1$, $A_2$ and $A_3$ and four link portions $B_1$, $B_2$, $B_3$ and $B_4$ is formed on a center region.

Now, each lengths of an example as shown in FIG. 1 are described in the following lines:
L1=100 mm, L2=30 mm, L3=20 mm,
L4=20 mm, L5=10 mm.

As in FIG. 2, the inside flexible substrate 1 comprises a first base member 1f and thereon a first printed circuit 1c and a first insulating member 1d. Furthermore, in the inside flexible substrate 1, a first connecting part 1a is provided at one end part of the first base member 1f, and a second connecting part 1b is provided at the other end part of the first base member 1f. The first printed circuit 1c on one surface of the first base member 1f is formed by a printing method; and the first printed circuit 1c is covered with the first insulating member 1d except for the first connecting part 1a and the second connecting part 1b. Similarly, the outside flexible substrate 2 comprises a second base member 2f and thereon a second printed circuit 2c and second insulating member 2d. Furthermore, in the outside flexible substrate 2, a third connecting part 2a is provided at one end part of the second base member 2f, and a fourth connecting part 2b is provided at the other end part of the second base member 2f. The second printed circuit 2c on one surface of the second base member 2f is formed by the printing method. Further, And the second printed circuit 2c is covered with the second insulating member 2d except for the third connecting part 2a and the fourth connecting part 2b.

Subsequently, in the composite flexible substrate 100, the inside flexible substrate 1 is mechanically fixed on the outside flexible substrate 2 by welding the first connecting part 1a and the second connecting part 1b to the third connecting part 2a and the fourth connecting part 2b, respectively. Thereby, the first printed circuit 1c is electrically connected with the second printed circuit 2c. In many cases in such composite flexible substrate 100, an electro-static shielding sheet (not shown) is formed on the other surface (which is above the top face) of the second base member 2f.

Apart from the aforementioned prior art, where the first printed circuit 1c is electrically connected with the second printed circuit 2c, an alternative configuration may be such that the first printed circuit 1c is not electrically connected with the second printed circuit 2c in a manner that the first printed circuit 1c is not formed on the first connecting part 1a.

Now, each materials and lengths of an example as shown in FIG. 2 will be described in the following lines:
the first and second base member 1f and 2f are of "PET"[poly(ethyleneterephthalate)]
the first and second printed circuit 1c and 2c are of "AgC"
the first and second insulating member 1d and 2d are of "resin"
T6=75 μm, T7=10 μm, T8=60 μm.

Subsequently, it will be elucidated that the composite flexible substrate 100 is in bent condition in a manner that the inside flexible substrate 1 is bent in downward direction of FIG. 2.

Figure 3:
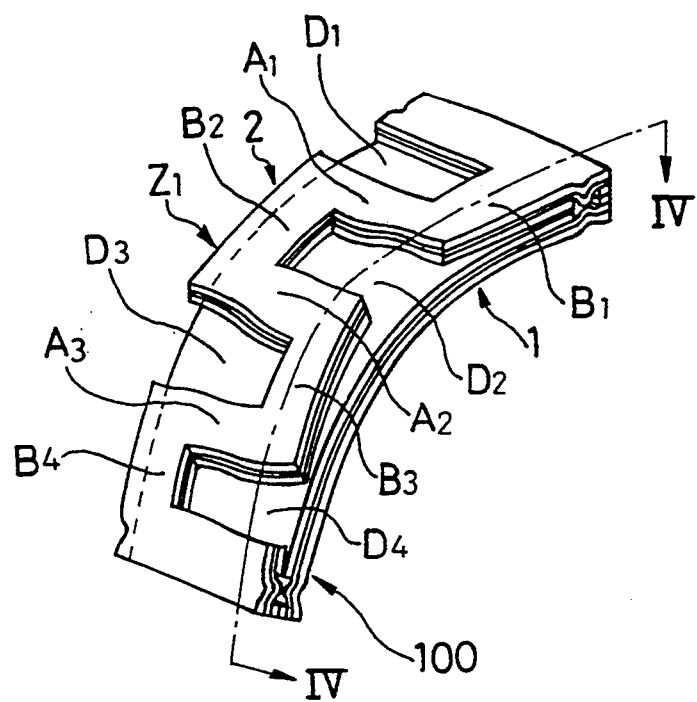
FIG. 3 is a perspective view showing the composite flexible substrate, which is in a bent condition, of the first embodiment of the present invention.
Figure 4:
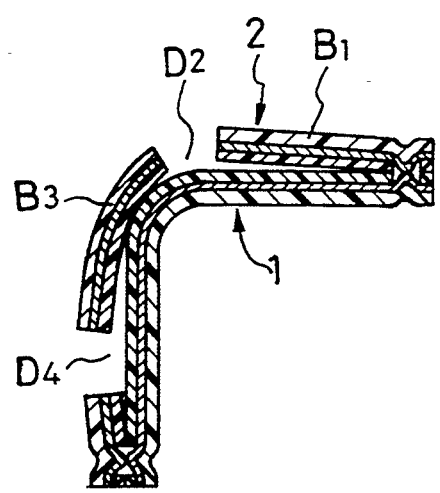
FIG. 4 is a vertical sectional view taken on line IV—IV showing the composite flexible substrate, which is in a bent condition, of the first embodiment of the present invention.

FIG. 3 is a perspective view showing the composite flexible substrate, which is in a bent condition. of the first embodiment of the present invention. FIG. 4 is a vertical sectional view taken on line IV—IV showing the composite flexible substrate, which is in a bent condition, of the first embodiment of the present invention.

In FIGS. 3 and 4, the outside flexible substrate 2 is provided with the zigzag-shaped part $Z_1$ in a bent portion in order that, when the composite flexible substrate 100 is installed in an electric apparatus (not shown), the composite flexible substrate 100 is orderly deformed without irregular wrinkle-shaped deformation. Namely, as can be seen from FIGS. 3 and 4, the zigzag-shaped part $Z_1$ is partially warped and partly detached from the surface of the inside flexible substrate 1 as a result of stretching the whole length hence extending opening ends of four opening portions D1, D2, D3 and D4. Furthermore, in this first embodiment, the opening portion D2 and the opening portion D3 are extended more than the opening portion D1 and the opening portion D4. The extendings of the openings D1, D2, D3 and D4 are accompanied by the strains of the crosswise arm portions A1, A2 and A3. Apart from the prior art, the inside flexible substrate 1 does not generate the irregular wrinkle-shaped deformation.

SECOND EXAMPLE

Figure 5:
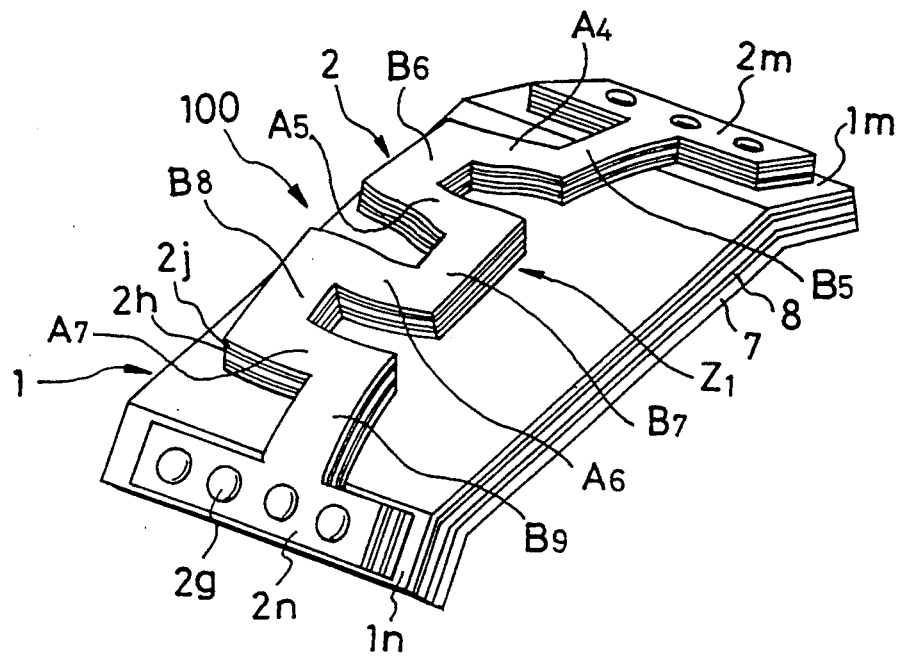
FIG. 5 is a perspective view showing a composite flexible substrate of a second embodiment of the present invention.

FIG. 5 is a perspective view showing a composite flexible substrate of a second embodiment of the present invention. In this second embodiment, the same components and parts as those of the first embodiment are designated by the same numerals and corresponding descriptions similarly apply. Therefore, the descriptions will be made mainly on the difference of the second embodiment from the first embodiment.

In FIG. 5, the composite flexible substrate 100 is bent only at two connecting portions, to which both ends of the outside flexible substrate 2 and the inside flexible substrate 1 are fixed, and under the zigzag-shaped part $Z_1$ the inside flexible substrate 1 is retained flat. Furthermore, an electro-static shielding sheet $2h$ is formed on the opposite surface of the second base member $2f$, and is covered with a third insulating member $2j$. Conventional diaphragm type contact buttons $2g$, are provided which are hemispherically projected parts of an extended part of the second base member $2f$ and constitute diaphragm type switches together with contact points of the first printed circuit $1c$ and contact points of the second printed circuit $2c$. Furthermore, in the outside flexible substrate 2, the zigzag-shaped part $Z_1$ comprises four crosswise arm portions $A_4$, $A_5$, $A_6$ and $A_7$ and five link portions $B_5$, $B_6$, $B_7$, $B_8$ and $B_9$.

Both end parts $2m$ and $2n$ of the outside flexible substrate 2 are mechanically fixed on end parts $1m$ and $1n$ of the inside flexible substrate 1. The composite flexible substrate 100 consisting of the inside flexible substrate 1 and the outside flexible substrate 2 are firmly fixed via a pressure sensitive adhesive double coated tape 8 on a rigid carrier 7 which is made of "ABS" in a trapezoidal shape. And the carrier 7 is installed at the electric apparatus (not shown).

THIRD EXAMPLE

Figure 6:
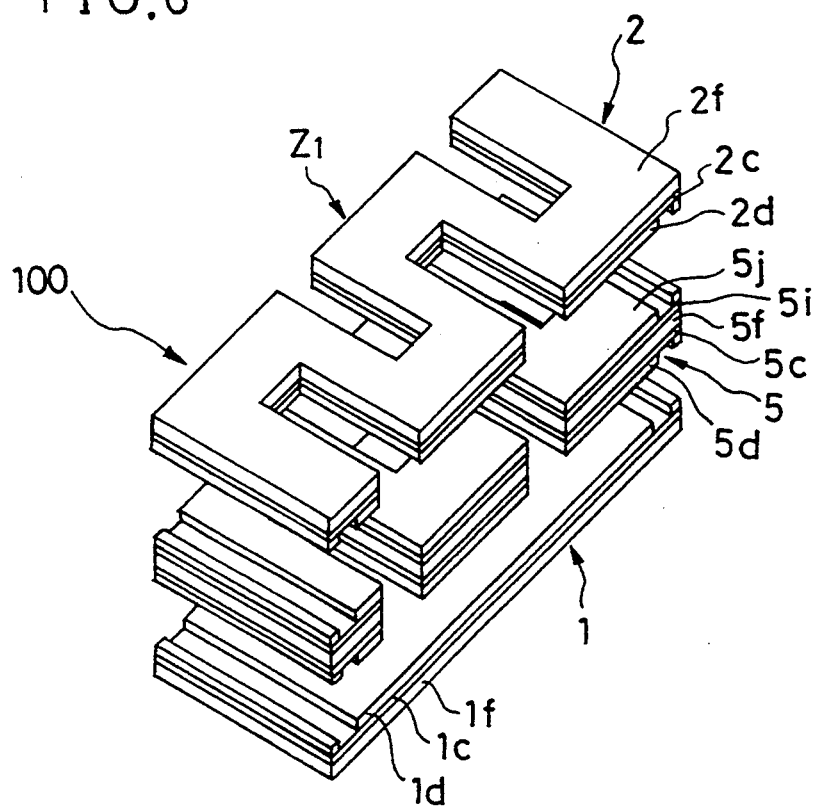
FIG. 6 is a perspective view showing a composite flexible substrate of a third embodiment of the present invention.
Figure 7:
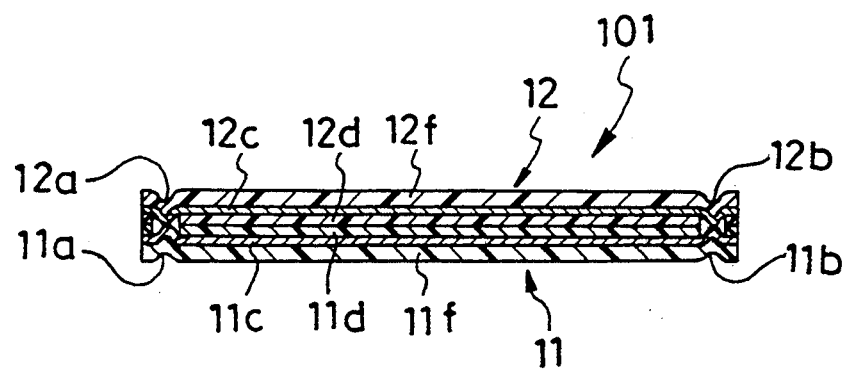
FIG. 7 is a vertical sectional view showing a conventional composite flexible substrate.
Figure 8:
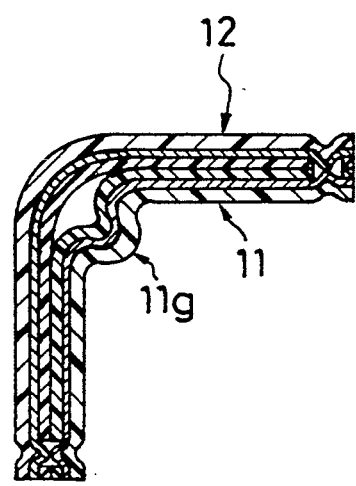
FIG. 8 is a vertical sectional view showing a conventional composite flexible substrate which is in bent condition.

FIG. 6 is a perspective view showing a composite flexible substrate of a third embodiment of the present invention. In this third embodiment, the same components and parts as those of the first embodiment are designated by the same numerals and corresponding descriptions similarly apply. Therefore, the descriptions will be made mainly on the difference of the third embodiment from the first embodiment.

In FIG. 6, the composite flexible substrate 100 is constituted with the inside flexible substrate 1, the outside flexible substrate 2 and an intermediate (third) flexible substrate 5 disposed between the inside flexible substrate 1 and the outside flexible substrate 2 and having a zigzag-shape part $Z_2$. The intermediate flexible substrate 5 has, on both faces of a third base member $5f$, respective third and fourth printed circuits $5c$ and $5i$, and further thereon respective third and fourth insulating members $5d$ and $5j$. After piling up the inside flexible substrate 1, the intermediate flexible substrate 5 and the outside flexible substrate 2 in that order, both end parts of the composite flexible substrate 100 are mechanically fixed by welding. The outside flexible substrate 2 and the intermediate flexible substrate 5 are provided with the zigzag-shape parts $Z_1$ and $Z_2$. When the composite flexible substrate 100 is bent similarly to FIG. 4, the outside flexible substrate 2 and the intermediate flexible substrate 5 are orderly deformed without irregular wrinkle-shaped deformation.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

What is claimed is:

1. A composite flexible substrate comprising:

a first flexible substrate having a first base member, a first printed circuit and a first insulating member, said first base member having a first connecting part at one end part and a second connecting part at the other end part, said first printed circuit being formed on said first base member and substantially covered with said first insulating member, and a second flexible substrate having a second base member, a second printed circuit and a second insulating member, said second base member having a third connecting part at one end part and a fourth connecting part at the other end part, said second printed circuit being formed on said second base member and substantially covered with said second insulating member, said second flexible substrate being fixed over said first flexible substrate by fixing together said first connecting part and said second connecting part to said third connecting part and said fourth connecting part, respectively, said second flexible substrate having a zigzag-shaped central portion which is constructed and arranged to deform and extend said second flexible substrate in overall length between the third and fourth connecting parts to prevent irregular deformation of said first flexible substrate when said composite flexible substrate is longitudinally bent in a direction to stretch said zigzag-shaped portion.

2. A composite flexible substrate in accordance with claim 1, further comprising:

a third flexible substrate disposed between said first flexible substrate and said second flexible substrate and having a third base member, a third printed circuit, a fourth printed circuit, a third insulating member and a fourth insulating member, said third flexible substrate being provided with a zigzag-shaped part in a center region, said third printed circuit being formed on one face of said third base member and covered with said third insulating member, said fourth printed circuit being formed on the other face of said third base member and covered with said fourth insulating member.

* * * * *